(12) United States Patent
Park et al.

(10) Patent No.: US 11,848,307 B2
(45) Date of Patent: Dec. 19, 2023

(54) SEMICONDUCTOR PACKAGE

(71) Applicant: SAMSUNG ELECTRONICS CO., LTD., Suwon-si (KR)

(72) Inventors: Sungwoo Park, Seongnam-si (KR); Ungcheon Kim, Cheonan-si (KR); Heonwoo Kim, Cheonan-si (KR); Yunseok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 264 days.

(21) Appl. No.: 17/478,247

(22) Filed: Sep. 17, 2021

(65) Prior Publication Data

US 2022/0199577 A1 Jun. 23, 2022

(30) Foreign Application Priority Data

Dec. 23, 2020 (KR) .......................... 10-2020-0181669

(51) Int. Cl.
| | |
|---|---|
| *H01L 23/48* | (2006.01) |
| *H01L 25/065* | (2023.01) |
| *H01L 23/498* | (2006.01) |
| *H01L 23/367* | (2006.01) |
| *H01L 23/31* | (2006.01) |
| *H01L 23/00* | (2006.01) |

(52) U.S. Cl.
CPC ...... *H01L 25/0655* (2013.01); *H01L 23/3121* (2013.01); *H01L 23/367* (2013.01); *H01L 23/481* (2013.01); *H01L 23/49811* (2013.01); *H01L 23/49833* (2013.01); *H01L 23/562* (2013.01)

(58) Field of Classification Search
CPC .............. H01L 23/562; H01L 23/4983; H01L 23/49811; H01L 23/481; H01L 23/367; H01L 23/3121; H01L 25/0655
See application file for complete search history.

(56) References Cited

U.S. PATENT DOCUMENTS

| | | |
|---|---|---|
| 7,030,496 B2 | 4/2006 | Shinyama et al. |
| 7,411,303 B2 | 8/2008 | Abbott |
| 8,039,385 B1 | 10/2011 | West et al. |
| 8,227,295 B2 | 7/2012 | Simmons-Matthews et al. |
| 8,492,896 B2 | 7/2013 | Nakano |
| 9,812,380 B2 | 11/2017 | Dix et al. |

(Continued)

*Primary Examiner* — Hoa B Trinh
(74) *Attorney, Agent, or Firm* — Sughrue Mion, PLLC

(57) ABSTRACT

A semiconductor package includes a base substrate and an interposer substrate. The interposer substrate includes a semiconductor substrate, a first passivation layer, a wiring region, a through via penetrating through the semiconductor substrate and the first passivation layer, and a second passivation layer covering at least a portion of the first passivation layer and having an opening exposing a lower surface of the through via. The semiconductor package further includes a conductive pillar extending from the opening of the second passivation layer; and a conductive bump disposed between the conductive pillar and the base substrate. The opening of the second passivation layer has inclined side surfaces such that a width of the opening decreases towards the first passivation layer, and side surfaces of the conductive pillar are positioned to overlap the inclined side surfaces of the second passivation layer in a vertical direction.

20 Claims, 13 Drawing Sheets

(56) References Cited

U.S. PATENT DOCUMENTS

| | | | |
|---|---|---|---|
| 10,090,185 B2 | 10/2018 | Paek et al. | |
| 2019/0006317 A1 | 1/2019 | Yu et al. | |
| 2020/0013745 A1 | 1/2020 | Lee et al. | |
| 2020/0211970 A1* | 7/2020 | Gomes | H01L 23/5385 |
| 2020/0212006 A1* | 7/2020 | Chang | H01L 25/50 |
| 2021/0098421 A1* | 4/2021 | Wu | H01L 24/16 |
| 2021/0193542 A1* | 6/2021 | Chang | H01L 23/49822 |
| 2022/0352130 A1* | 11/2022 | Lee | H01L 21/4853 |

\* cited by examiner

SEMICONDUCTOR PACKAGE

CROSS-REFERENCE TO THE RELATED APPLICATION

This application claims priority under 35 U.S.C. 119 to Korean Patent Application No. 10-2020-0181669, filed on Dec. 23, 2020, with the Korean Intellectual Property Office, the disclosure of which is incorporated herein by reference in its entirety.

BACKGROUND

1. Field

Embodiments of the present disclosure relate to a semiconductor package.

2. Description of Related Art

Recently, a system in package (SIP) in which a plurality of semiconductor chips are mounted in one package has been developed. In order to form a fine wiring connecting semiconductor chips in the package, an interposer substrate including a through silicon via (TSV) has been used.

SUMMARY

An aspect of the present disclosure is to provide a semiconductor package having improved reliability.

According to one or more embodiments of the present disclosure, a semiconductor package is provided. The semiconductor package includes a base substrate including a first wiring structure; and an interposer substrate. The interposer substrate including: a semiconductor substrate having a first surface facing the base substrate, and a second surface opposite of the first surface, a first passivation layer covering at least a portion of the first surface, a wiring region disposed on the second surface and comprising a second wiring structure, a through via penetrating through the semiconductor substrate and the first passivation layer to electrically connect the second wiring structure and the first wiring structure, and a second passivation layer covering at least a portion of the first passivation layer and having an opening exposing a lower surface of the through via. The semiconductor package may further include a conductive pillar disposed between the base substrate and the interposer substrate, extending from the opening of the second passivation layer, and connected to the through via; a conductive bump disposed between the conductive pillar and the base substrate, and electrically connecting the through via and the first wiring structure; an underfill resin that fills space between the base substrate and the interposer substrate; and a first semiconductor chip and a second semiconductor chip disposed on the wiring region of the interposer substrate, and electrically connected to each other through the second wiring structure, wherein the opening of the second passivation layer has inclined side surfaces such that a width of the opening decreases towards the first passivation layer, and wherein side surfaces of the conductive pillar are positioned to overlap the inclined side surfaces of the second passivation layer in a vertical direction.

According to one or more embodiments of the present disclosure, semiconductor package is provided. The semiconductor package includes an interposer substrate including: a semiconductor substrate, a first passivation layer on a first surface of the semiconductor substrate, a wiring region on a second surface of the semiconductor substrate, a through via penetrating through the semiconductor substrate and the first passivation layer and electrically connected to the wiring region, and a second passivation layer having an opening exposing a lower surface of the through via. The semiconductor package further includes a plurality of semiconductor chips disposed on the wiring region of the interposer substrate; a conductive pillar connected to the through via through the opening of the second passivation layer; and a conductive bump disposed below the conductive pillar, wherein the opening of the second passivation layer has inclined side surfaces such that a width of the opening decreases towards the first passivation layer, and wherein the conductive pillar is in contact with a portion of a lower surface of the first passivation layer and a portion of the inclined side surfaces of the second passivation layer.

According to one or more embodiments of the present disclosure, semiconductor package is provided. The semiconductor package includes an interposer substrate including a semiconductor substrate having a first surface and a second surface that is opposite to the first surface, a first passivation layer covering at least a portion of the first surface, wiring layers disposed on the second surface, through vias penetrating through the semiconductor substrate and the first passivation layer, and electrically connected to the wiring layers, and a second passivation layer covering at least a portion of the first passivation layer and having openings exposing a lower surface of each of the through vias. The semiconductor package further includes a plurality of semiconductor chips disposed on the interposer substrate, and electrically connected to each other through the wiring layers; conductive pillars respectively connected to the through vias through each of the openings; conductive bumps disposed below each of the conductive pillars; and a base substrate comprising pads respectively connected to the conductive bumps, and further comprising a wiring structure electrically connected to the pads, wherein one or more of the openings of the second passivation layer have inclined side surfaces such that widths of the one or more openings decrease towards the first passivation layer, wherein side surfaces of one or more of the conductive pillars are positioned to overlap the inclined side surfaces of the second passivation layer in a vertical direction, and wherein the conductive pillars and the through vias are directly connected without a connection pad therebetween, respectively.

BRIEF DESCRIPTION OF DRAWINGS

The above and other aspects, features, and advantages of the present inventive concept will be more clearly understood from the following detailed description taken in conjunction with the accompanying drawings, in which:

FIG. 5C-1 is a third view for illustrating the process sequence to describe the method of manufacturing the semiconductor package according to the example embodiments;

FIG. 5C-2 is an enlarged view of a region in FIG. 5C-1;

FIG. 5D-1 is a fourth view for illustrating the process sequence to describe the method of manufacturing the semiconductor package according to the example embodiments;

FIG. 5D-2 is an enlarged view of a region in FIG. 5D-1;

FIG. 5E-1 is a fifth view for illustrating the process sequence to describe the method of manufacturing the semiconductor package according to the example embodiments;

FIG. 5E-2 is an enlarged view of a region in FIG. 5E-1;

FIG. 5F-1 is a sixth view for illustrating the process sequence to describe the method of manufacturing the semiconductor package according to the example embodiments;

FIG. 5F-2 is an enlarged view of a region in FIG. 5F-1;

DETAILED DESCRIPTION

Hereinafter, non-limiting example embodiments of the present disclosure will be described with reference to the accompanying drawings.

Figure 1:
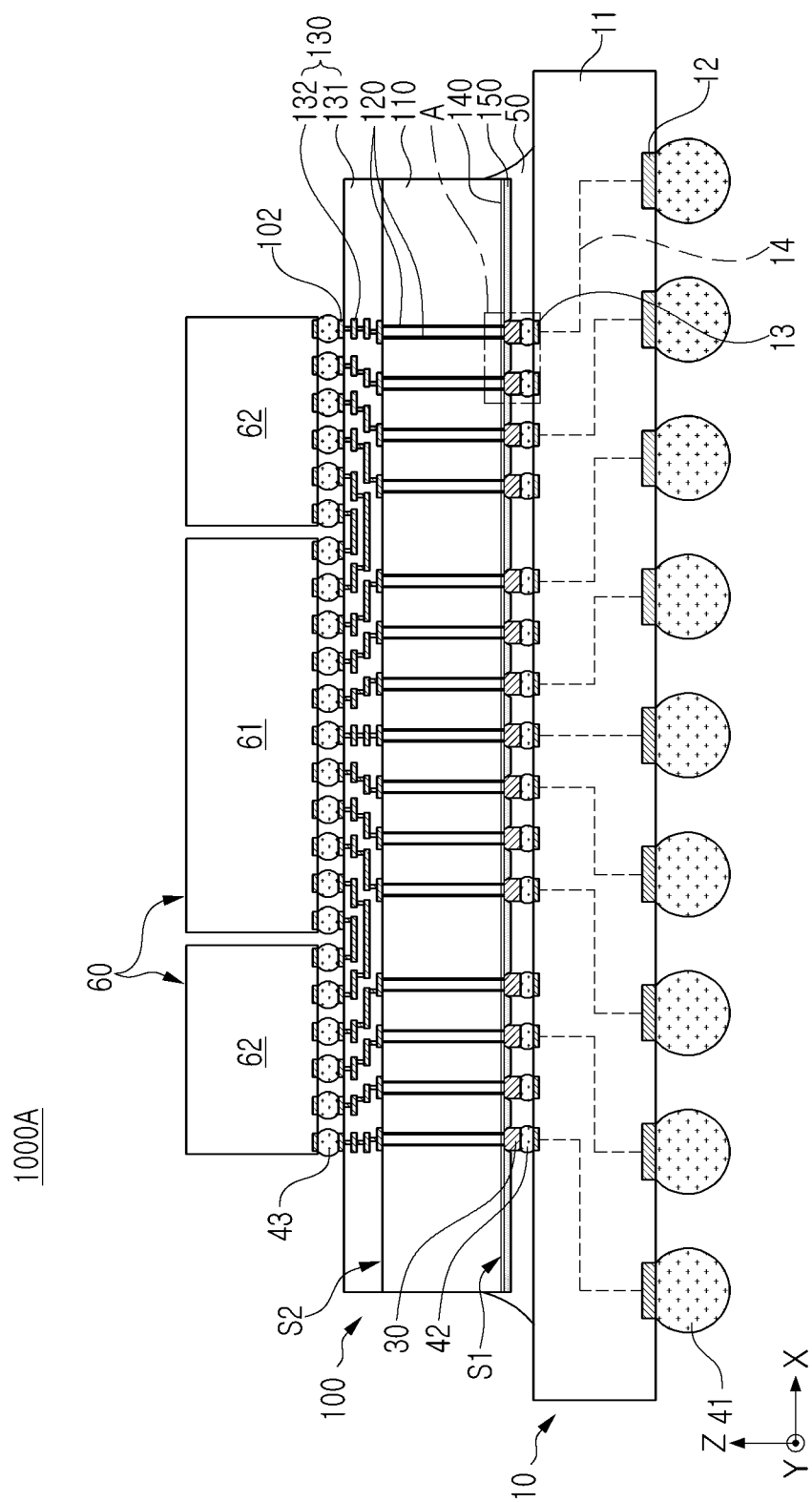
FIG. 1 is a cross-sectional view illustrating a semiconductor package according to example embodiments.
Figure 2A:
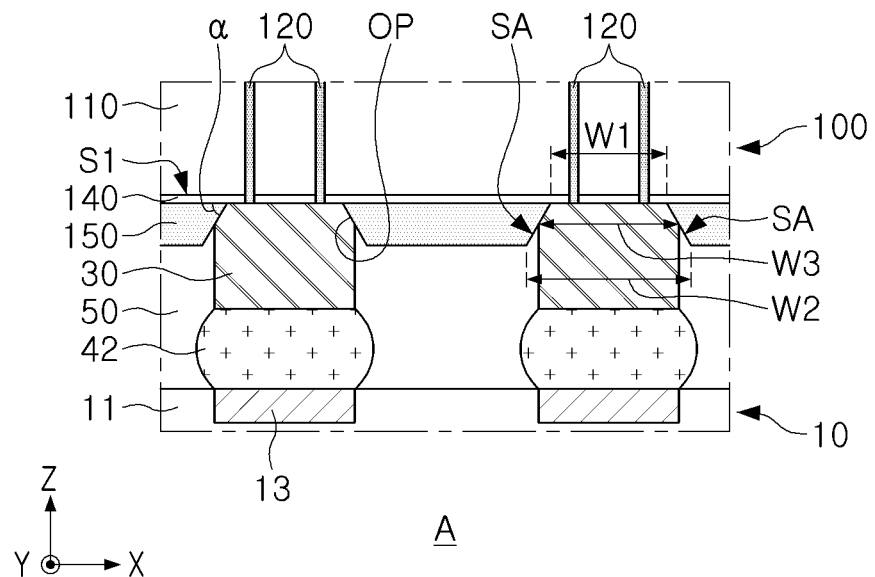
FIG. 2A is a partially enlarged cross-sectional view illustrating a region including a conductive pillar of a semiconductor package according to example embodiments.

FIG. 1 is a cross-sectional view illustrating a semiconductor package according to example embodiments. FIG. 2A is a partially enlarged cross-sectional view illustrating a region including a conductive pillar of a semiconductor package according to example embodiments. FIG. 2A is an enlarged view of region "A" of FIG. 1.

Referring to FIGS. 1 and 2A, a semiconductor package 1000A may include a base substrate 10, an interposer substrate 100, conductive pillars 30, a first conductive bump 41, a second conductive bump 42, a third conductive bump 43, an underfill resin 50, and semiconductor chips 60.

The base substrate 10 may include a substrate body 11, pads 12 and 13 respectively disposed on a lower surface and an upper surface of the substrate body 11, and a first wiring structure 14 electrically connecting the pads 12 and 13. The base substrate 10 may be a support substrate on which the interposer substrate 100 and the semiconductor chips 60 are mounted, and may be a substrate for a semiconductor package including a printed circuit board (PCB), a ceramic substrate, a glass substrate, a tape wiring board, or the like.

The substrate body 11 may include different materials according to the type of the base substrate 10. For example, when the base substrate 10 is a printed circuit board, the substrate body 11 may have a form in which a copper clad laminate or a wiring layer is additionally stacked on one side or both sides of the copper clad laminate. A lower protective layer and an upper protective layer to which a solder resist is applied may be formed on the lower surface and the upper surface of the body, respectively.

The pads 12 and 13 and the first wiring structure 14 may form an electrical path connecting the lower surface and the upper surface of the base substrate 10. The pads 12 and 13 and the first wiring structure 14 may include a metal material, for example, at least one metal of copper (Cu), aluminum (Al), nickel (Ni), silver (Ag), gold (Au), platinum (Pt), tin (Sn), Lead (Pb), titanium (Ti), chromium (Cr), palladium (Pd), indium (In), zinc (Zn) and carbon (C), or an alloy containing two or more metals. The first wiring structure 14 may include a single-layered or multi-layered wiring layer formed inside the base substrate 10 and a via connecting the same.

The interposer substrate 100 may include a semiconductor substrate 110, a through via 120, a wiring region 130, a first passivation layer 140, and a second passivation layer 150. The semiconductor substrate 110 may be disposed on the base substrate 10, and may have a first surface S1 facing the base substrate 10 and a second surface S2 opposite of the first surface S1. The semiconductor substrate 110 may be a semiconductor wafer. The semiconductor substrate 110 may include a semiconductor element such as silicon or germanium, or a compound semiconductor such as silicon carbide (SiC), gallium arsenide (GaAs), indium arsenide (InAs), and indium phosphide (InP).

The through via 120 may be a through silicon via (TSV) penetrating through the semiconductor substrate 110 in a vertical direction (Z direction). The through via 120 may penetrate through the first passivation layer 140 in a vertical direction (Z direction). The through via 120 may electrically connect a second wiring structure 132 above the interposer substrate 100 and the first wiring structure 14 of the base substrate 10.

The through via 120 may include a conductive plug and a barrier film surrounding the conductive plug. The conductive plug may include a metallic material, for example, tungsten (W), titanium (Ti), aluminum (Al), or copper (Cu). The barrier film may include an insulating barrier film and/or a conductive barrier film. The insulating barrier film may be formed of an oxide film, a nitride film, a carbide film, a polymer, or a combination thereof. The conductive barrier film may be disposed between the insulating barrier film and the conductive plug. The conductive barrier film may include, for example, a metal compound such as tungsten nitride (WN), titanium nitride (TiN), or tantalum nitride (TaN).

The wiring region 130 may be disposed on a front side of the interposer substrate 100 or on the second surface S2 of the semiconductor substrate 110, and may include a first interlayer insulating layer 131 and the second wiring structure 132. The first interlayer insulating layer 131 may be disposed on the second surface S2 of the semiconductor substrate 110, and may include silicon oxide or silicon nitride. The second wiring structure 132 may interconnect a plurality of semiconductor chips 60, or may connect a plurality of semiconductor chips 60 to the base substrate 10. The second wiring structure 132 may include one or more layers of metal wirings and contact vias. The first passivation layer 140 and the second passivation layer 150 may be disposed on a bottom surface or a back surface of the interposer substrate 100. The first passivation layer 140 may cover at least a portion of the first surface S1 of the interposer substrate 100. The second passivation layer 150 may cover at least a portion of the first passivation layer 140 and have an opening OP for exposing the lower surface of the through via 120. The through via 120 and one of the conductive pillars 30 may be connected through the opening OP. The first passivation layer 140 may include at least one of silicon oxide, silicon nitride, and silicon oxynitride. The second passivation layer 150 may include an insulating polymer, for example, photosensitive polyimide (PSPI). A thickness of the second passivation layer 150 may be greater than the thickness of the first passivation layer 140.

The opening OP of the second passivation layer 150 may have inclined side surfaces SA such that a width therebetween decreases closer to the first passivation layer 140. Accordingly, the opening OP of the second passivation layer 150 may have a first width W1 that is a minimum width at an upper end, and a second width W2 that is a maximum width at a lower end. Here, the first width W1 and the second width W2 may mean a diameter of a region in which the second passivation layer 150 is exposed by the opening OP. An angle α formed between the inclined side surfaces SA and the upper surface of the second passivation layer 150 may be less than about 90°. The angle α may be, for example, about 60° or more and less than about 90°. The angle α may be, for example, about 75° or more and less than about 90°. Since a connection pad is not disposed on the back surface of the interposer substrate 100, the second passivation layer 150 may not include a step or a bent portion other than the opening OP, and accordingly, crack generation of the second passivation layer 150 can be minimized.

The conductive pillars 30 may be disposed to extend downwardly from the opening OP of the second passivation layer 150. The conductive pillars 30 may be connected to a through via 120 by contacting a lower surface of the through via 120 that is exposed by the opening OP. In other words, the conductive pillars 30 and the through via 120 may be directly connected without a connection pad therebetween. The conductive pillars 30 may each be connected to at least two of the through via 120, and may be positioned to overlap at least two of the through via 120 in a vertical direction (Z direction). The conductive pillars 30 may include a metal material, for example, at least one metal among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C) or an alloy containing two or more metals thereof Side surfaces of the conductive pillars 30 may overlap the inclined side surfaces SA of the second passivation layer 150 in a vertical direction (Z direction). The conductive pillars 30 may contact a portion of the lower surface of the first passivation layer 140 and a portion of the inclined side surfaces SA of the second passivation layer 150.

Accordingly, an upper region of the side surfaces of the conductive pillars 30 may be inclined to correspond to the inclined side surfaces SA of the second passivation layer 150. In other words, the conductive pillars 30 may include a portion whose width continuously decreases closer to an upper end.

The third width W3 of the conductive pillars 30 in the opening OP may be greater than or equal to the first width W1 or less than or equal to the second width W2. In an example embodiment, an area in which the conductive pillars 30 contact the inclined side surfaces SA of the second passivation layer 150 may be larger than an area not in contact with the inclined side surfaces SA of the second passivation layer 150. For example, an area of a portion of one of the inclined side surfaces SA in contact with one of the conductive pillars 30 may be about 0.5 or more of the area of the one of the inclined side surfaces SA.

When an interposer substrate and a base substrate are connected, a change in chip warpage may be large due to the large thickness of the interposer substrate, such that non-wettability or short defects occur. A connection pad may disposed on the bottom surface of the semiconductor substrate to provide an electrical connection path, and also warpage is controlled by adjusting a portion of the metal layer. When there is no conductive pillar under the connection pad, a conductive bump may be disposed to contact the opening of a second passivation layer, and chip warpage is not induced, but when there is a conductive pillar, the conductive pillar may expand by heat, causing chip warpage. According to an example embodiment of the present disclosure, conductive pillars 30 may be provided, but are disposed so as to partially contact or overlap the side surfaces SA of the opening OP of the second passivation layer 150, thereby controlling chip warpage. In addition, as described above, since the chip warpage can be controlled, the through via 120 and the conductive pillars 30 can be directly connected without a connection pad therebetween, and process steps for forming the connection pad can be omitted, such that process costs may be reduced.

The first conductive bump 41, the second conductive bump 42, and the third conductive bump 43 may have a flip-chip connection structure, for example, a solder ball, or a grid array such as a pin grid array, a ball grid array, and a land grid array. The first conductive bump 41, the second conductive bump 42, and the third conductive bump 43 may include a metallic material, for example, at least one metal among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy containing two or more metals thereof. For example, the first conductive bump 41, the second conductive bump 42, and the third conductive bump 43 may include tin (Sn) or an alloy containing tin (Sn) (e.g., Sn—Ag—Cu).

The first conductive bump 41 on the lower surface of the base substrate 10 may connect the first wiring structure 14 to an external device (e.g., a main board). The second conductive bump 42 disposed between the base substrate 10 and the interposer substrate 100 may be connected to one of the conductive pillars 30 to connect the through via 120 of the interposer substrate 100 and the first wiring structure 14 of the base substrate 10. The third conductive bump 43 on the lower surface of one of the semiconductor chips 60 may connect the one of the semiconductor chips 60 and the second wiring structure 132 of the interposer substrate 100. The first conductive bump 41, the second conductive bump 42, and the third conductive bump 43 may have different sizes from each other. The first conductive bump 41 may be larger than the second conductive bump 42 and the third conductive bump 43, and the second conductive bump 42 may be larger than the third conductive bump 43.

The underfill resin 50 may fill a space between the interposer substrate 100 and the base substrate 10, and may surround the conductive pillars 30 and the second conductive bump 42. The underfill resin 50 may contact other portions of the inclined side surfaces SA of the second passivation layer 150 that do not contact the conductive pillars 30. The underfill resin 50 may extend to an edge of the interposer substrate 100 to cover a portion of a side surface of the interposer substrate 100. The underfill resin 50 may include an insulating polymer material, for example, an epoxy resin.

The semiconductor chips 60 may be mounted on an interposer substrate, and may be electrically connected through a wiring region 130 of a front side of the interposer substrate 100, more particularly a second wiring structure 132. The semiconductor chips 60 may include a first semiconductor chip 61 and a second semiconductor chip 62 including different types of integrated circuits. The first semiconductor chip 61 may include, for example, a logic chip such as a central processing unit (CPU), a graphics processing unit (GPU), a cryptographic processor, a microprocessor, a microcontroller, an analog-to-digital converter, and an application-specific IC (ASIC), and the like. The second semiconductor chip 62 may include, for example, a volatile memory device such as dynamic RAM (DRAM), static RAM (SRAM), or the like, a non-volatile memory device such as phase change RAM (PRAM), magnetic RAM (MRAM), resistive RAM (RRAM), a flash memory, or the like, or a high-performance memory device such as a high bandwidth memory (HBM), a hybrid memory cubic (HMC), or the like.

Figure 2B:
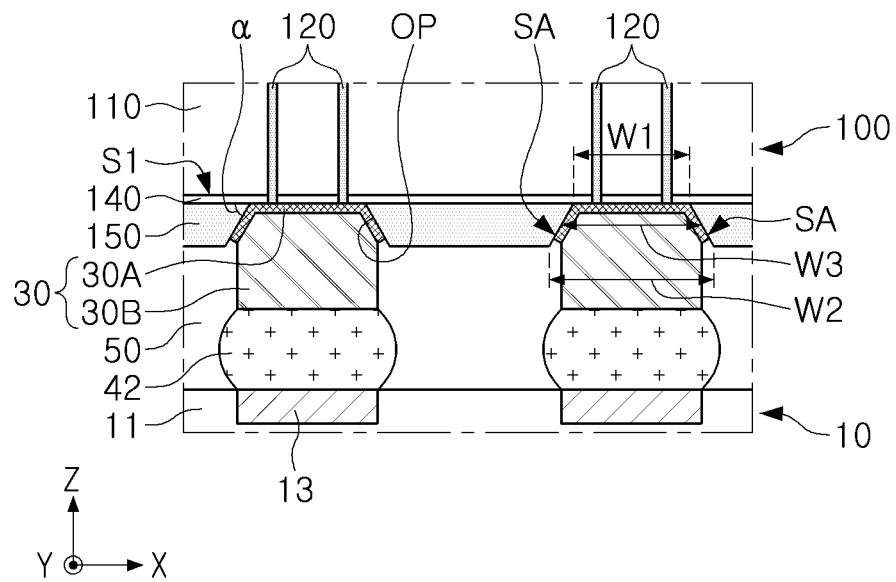
FIG. 2B is a partially enlarged cross-sectional view illustrating a region including a conductive pillar of a semiconductor package according to example embodiments.

FIG. 2B is a partially enlarged cross-sectional view illustrating a region including a conductive pillar of a semiconductor package according to example embodiments. FIG. 2B shows a region corresponding to FIG. 2A.

Referring to FIG. 2B, in a semiconductor package 1000B, the conductive pillars 30 may include an under bump metal layer 30A and a pillar layer 30B. The under bump metal layer 30A may have a bent portion within the opening OP of the second passivation layer 150, and may contact a portion of the inclined side surfaces SA of the second passivation layer 150. The under bump metal layer 30A may contact the through via 120. The pillar layer 30B may cover a lower surface of the under bump metal layer 30A.

Figure 2C:
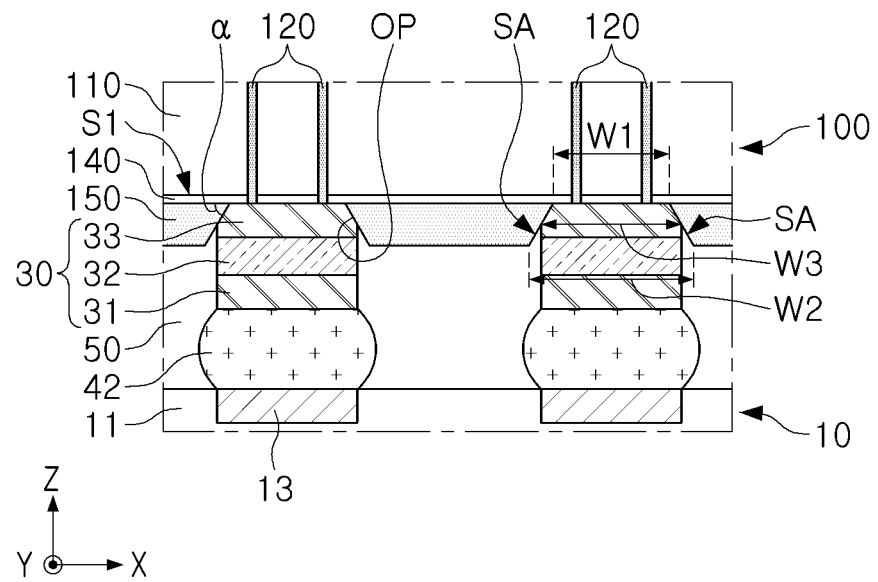
FIG. 2C is a partially enlarged cross-sectional view illustrating a region including a conductive pillar of a semiconductor package according to example embodiments.

FIG. 2C is a partially enlarged cross-sectional view illustrating a region including a conductive pillar of a semiconductor package according to example embodiments. FIG. 2C shows a region corresponding to FIG. 2A.

Referring to FIG. 2C, in a semiconductor package 1000C, the conductive pillars 30 may include a plurality of stacked conductive layers. The plurality of conductive layers may include a first conductive layer 31, a second conductive layer 32, and a third conductive layer 33 sequentially stacked on the second conductive bump 42. The first to third conductive layers 31, 32, and 33 may include materials that are the same as or different from each other. In an example embodiment, the first conductive layer 31 and the third conductive layer 33 may include copper (Cu), and the second conductive layer 32 may include nickel (Ni).

Figure 2D:
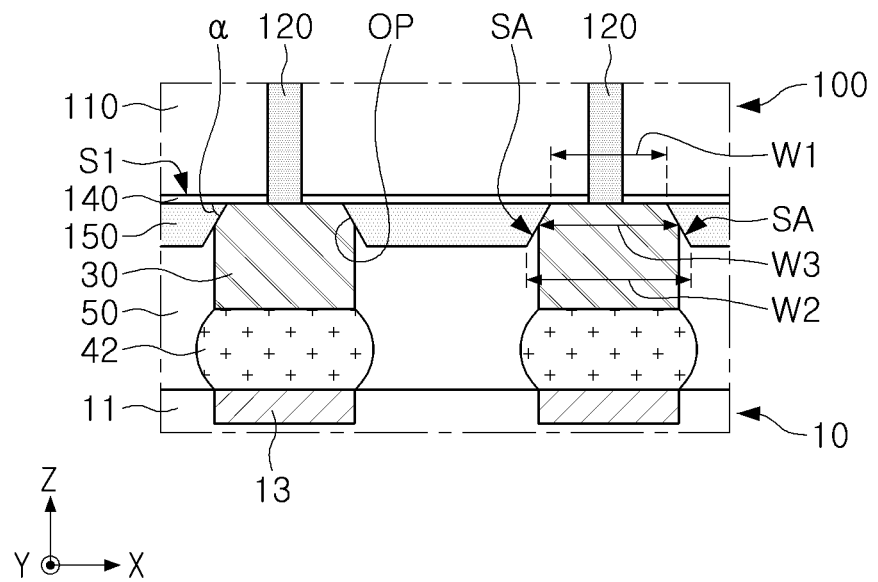
FIG. 2D is a partially enlarged cross-sectional view illustrating a region including a conductive pillar of a semiconductor package according to example embodiments.

FIG. 2D is a partially enlarged cross-sectional view illustrating a region including a conductive pillar of a semiconductor package according to example embodiments. FIG. 2D shows a region corresponding to FIG. 2A.

Referring to FIG. 2D, in a semiconductor package 1000D, one of the conductive pillars 30 may be connected to one through via 120. One through via 120 may be disposed to overlap the one of the conductive pillars 30 in a vertical direction (Z direction). The second passivation layer 150 may have a plurality of the opening OP to correspond to each of a plurality of the through via 120, and the conductive pillars 30 may be disposed to correspond to each of the plurality of the opening OP.

Figure 2E:
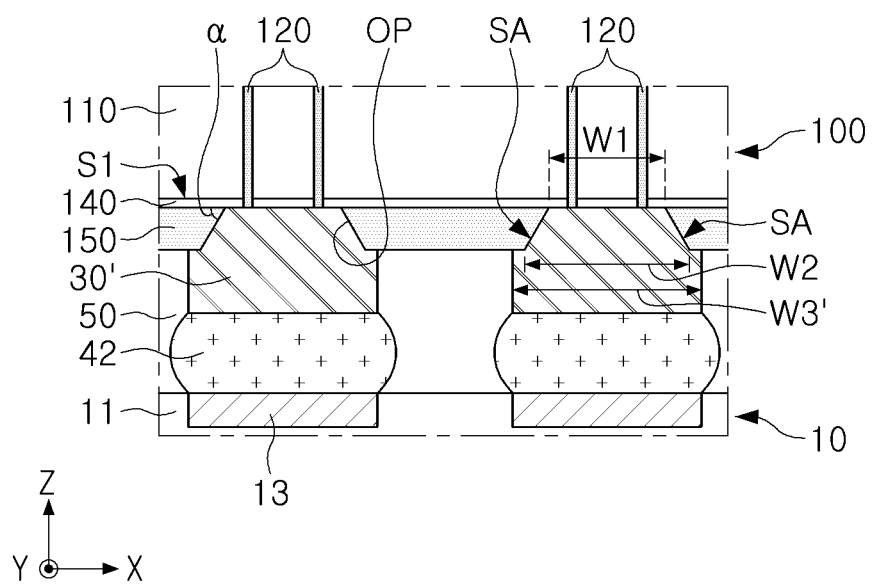
FIG. 2E is a partially enlarged cross-sectional view illustrating a region including a conductive pillar of a semiconductor package according to example embodiments.

FIG. 2E is a partially enlarged cross-sectional view illustrating a region including a conductive pillar of a semiconductor package according to example embodiments. FIG. 2E shows a region corresponding to FIG. 2A.

Referring to FIG. 2E, in a semiconductor package 1000E, a conductive pillar 30' may completely fill the opening OP of the second passivation layer 150 and contact the inclined side surfaces SA. The conductive pillar 30' may extend in a horizontal direction to cover a portion of the lower surface of the second passivation layer 150. Side surfaces of the conductive pillar 30' may be disposed further outside of the opening OP. A maximum width W3' of the conductive pillar 30' may be greater than the second width W2, which is a maximum width of the opening OP of the second passivation layer 150.

Figure 3:
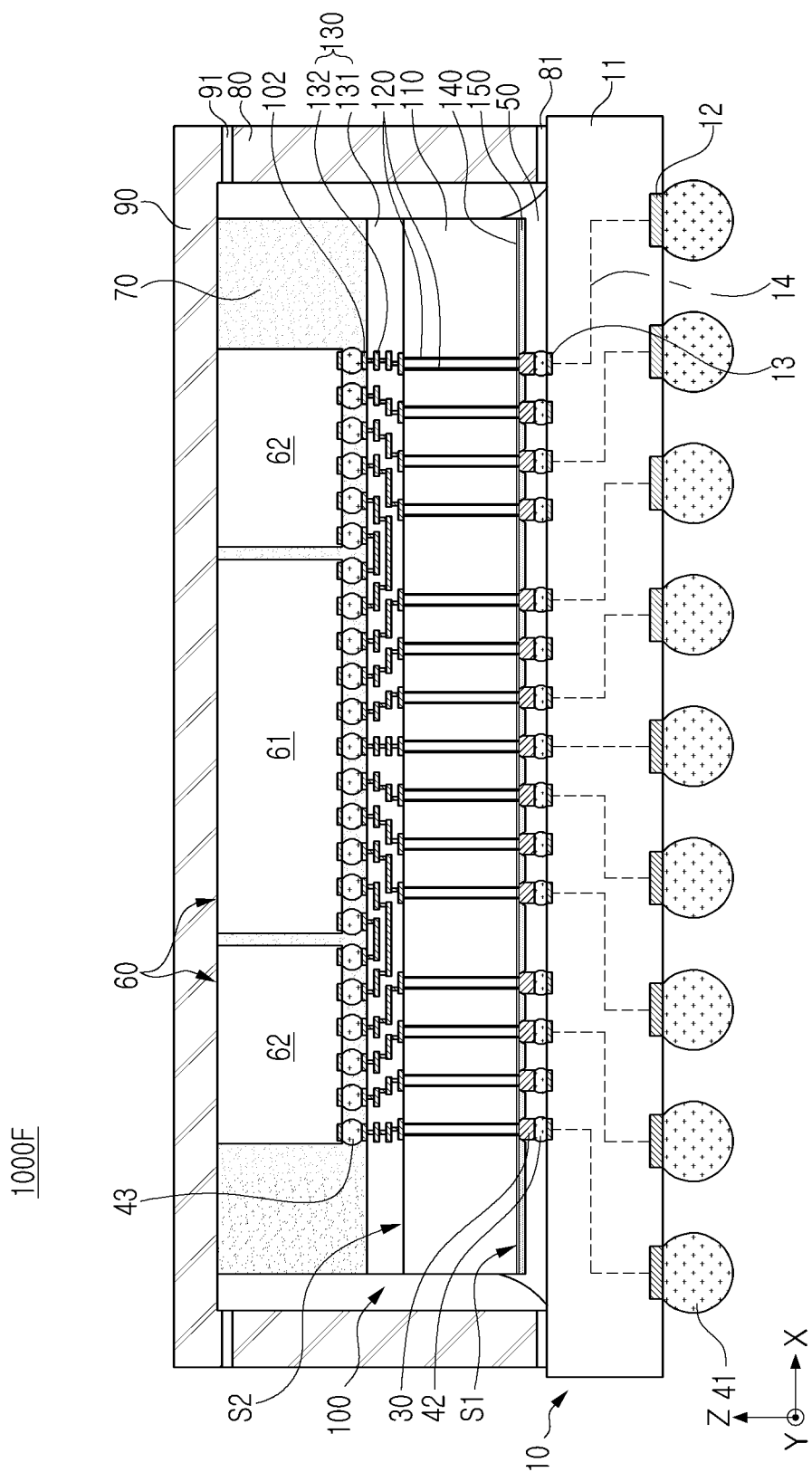
FIG. 3 is a cross-sectional view illustrating a semiconductor package according to example embodiments.

FIG. 3 is a cross-sectional view illustrating a semiconductor package according to example embodiments.

Referring to FIG. 3, a semiconductor package 1000F may further include a molding member 70 on the interposer substrate 100, and a stiffener 80 and a heat sink 90 on the base substrate 10. The molding member 70 may seal at least a portion of the semiconductor chips 60 on the interposer substrate 100. The molding member 70 may include, for example, a thermosetting resin such as an epoxy resin, a thermoplastic resin such as polyimide, or a prepreg including an inorganic filler and/or a glass fiber, an Ajinomoto Build-up Film (ABF), a FR-4, a Bismaleimide Triazine (BT), or an Epoxy Molding Compound (EMC).

An underfill resin filling space between the interposer substrate 100 and the semiconductor chips 60 may be further included. In this case, the underfill resin may be a part of the molding member 70 formed in a molded under-fill (MUF) method.

The stiffener 80 may be disposed on the base substrate 10 to control warpage of the package. The stiffener 80 may be disposed on the base substrate 10 to continuously or discontinuously surround side surfaces of the semiconductor chips 60. The stiffener 80 may be composed of a metal material, for example, aluminum (Al), silver (Ag), tin (Sn), gold (Au), nickel (Ni), lead (Pb), titanium (Ti), or an alloy thereof, and the like. The stiffener 80 may be attached on the base substrate 10 by an adhesive member 81. The adhesive member 81 may be, for example, a thermally conductive adhesive tape, a thermally conductive grease, or a thermally conductive adhesive.

The heat sink 90 may be disposed on the semiconductor chips 60 to dissipate heat generated from the semiconductor chips 60 externally. The heat sink 90 may be disposed on the stiffener 80 and may contact the semiconductor chips 60. The heat sink 90 may have a plate shape covering an upper surface of the semiconductor chips 60. The heat sink 90 may include a metal such as gold (Au), silver (Ag), copper (Cu), or a conductive material such as graphite or graphene. The heat sink 90 may be attached on the stiffener 80 or the semiconductor chips 60 by an adhesive member 91, similar to the stiffener 80.

Figure 4:
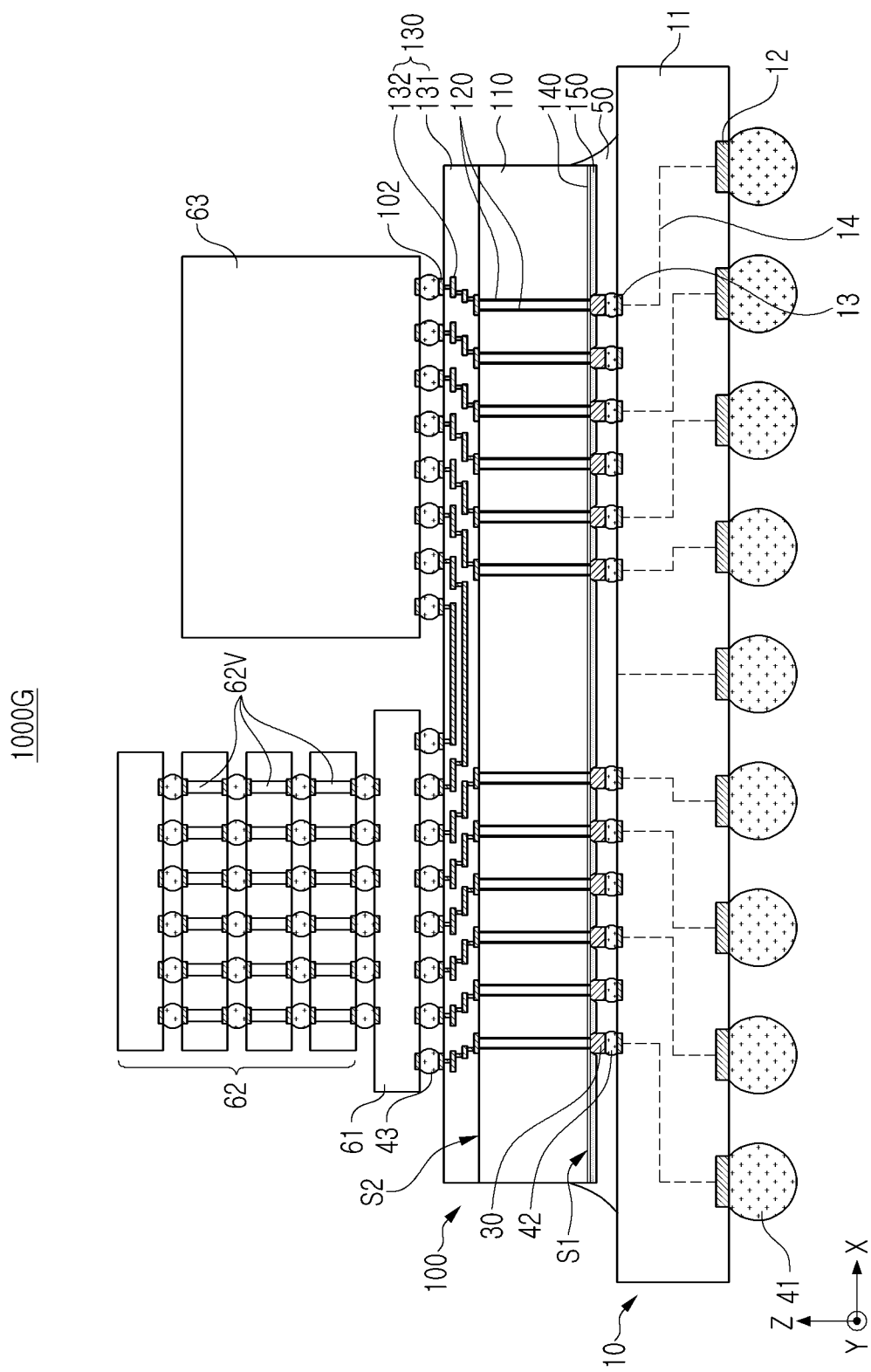
FIG. 4 is a cross-sectional view illustrating a semiconductor package according to example embodiments.

FIG. 4 is a cross-sectional view illustrating a semiconductor package according to example embodiments.

Referring to FIG. 4, a semiconductor package 1000G may include a first semiconductor chip 61, a plurality of the second semiconductor chip 62, and a third semiconductor chip 63 including different kinds of integrated circuits. The first semiconductor chip 61 may include a logic circuit communicating with the plurality of the second semiconductor chip 62 and the third semiconductor chip 63. The plurality of the second semiconductor chip 62 may be stacked in a vertical direction (Z direction) and may be connected to each other through a TSV 62V. The plurality of the second semiconductor chip 62 may include a volatile memory device such as DRAM and static RAM (SRAM), and a non-volatile memory device such as PRAM, MRAM, RRAM, a flash memory device, and the like. The first semiconductor chip 61 may store in or output data to the plurality of the second semiconductor chip 62 based on a signal. The third semiconductor chip 63 may be at least one of a central processing unit (CPU), a graphic processing unit (GPU), and a system-on-chip (SoC), and may be connected to enable communicate with the first semiconductor chip 61 through the second wiring structure 132. The third semiconductor chip 63 may also be disposed below the first semiconductor chip 61.

FIGS. 5A to 5F-2 are views illustrating a process sequence to describe a method of manufacturing a semiconductor package according to example embodiments.

Figure 5A:
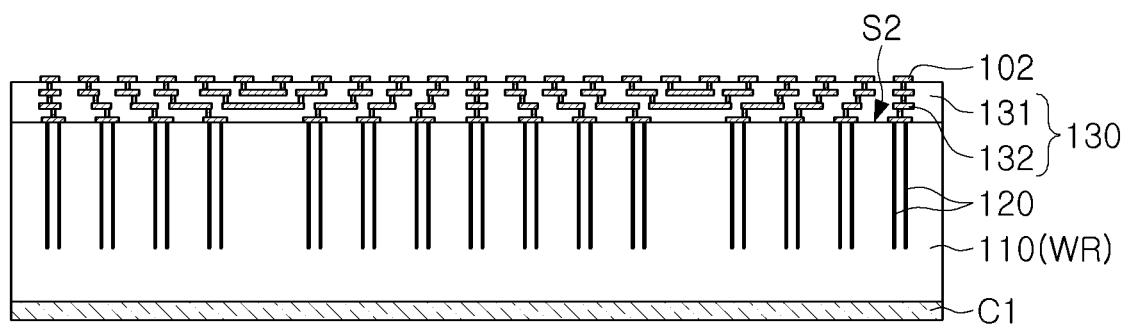
FIG. 5A is a first view for illustrating a process sequence to describe a method of manufacturing a semiconductor package according to example embodiments.

Referring to FIG. 5A, a through via 120, a wiring region 130, and an upper bump pad 102 may be formed on a semiconductor wafer WR on a first carrier C1. The through via 120 may extend into the semiconductor substrate 110 from the second surface S2 of the semiconductor substrate 110 or the semiconductor wafer WR. The through via 120 may include a conductive barrier film, a via insulating layer, or the like surrounding a side surface of a columnar shape. The via insulating film may be formed of an oxide film, a nitride film, a carbide film, a polymer or a combination thereof. The wiring region 130 may include a first interlayer insulating layer 131 and a wiring structure 132. The first interlayer insulating layer 131 may include a silicon oxide film. The second wiring structure 132 may include multi-layered metal wiring and contact vias. The upper bump pad 102 may be formed on a surface of the wiring region 130. The second wiring structure 132 may electrically connect the upper bump pad 102 and the through via 120. A portion of the second wiring structure 132 may interconnect a plurality of the upper bump pad 102. The through via 120 and the wiring region 130 may be formed by repeatedly performing a photolithography process, an etching process, a plating process, and a polishing process.

Figure 5B:
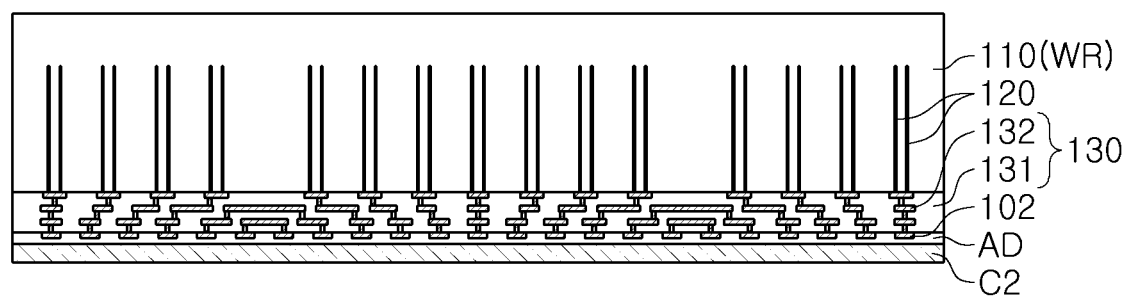
FIG. 5B is a second view for illustrating the process sequence to describe the method of manufacturing the semiconductor package according to the example embodiments.

Referring to FIG. 5B, the semiconductor wafer WR of FIG. 5A may be inverted and attached to a second carrier C2. An adhesive layer AD may be present on a surface of the second carrier C2. The semiconductor wafer WR may be attached to the second carrier C2 so that the upper bump pad 102 is buried in the adhesive layer AD.

Figures 1, 5C:
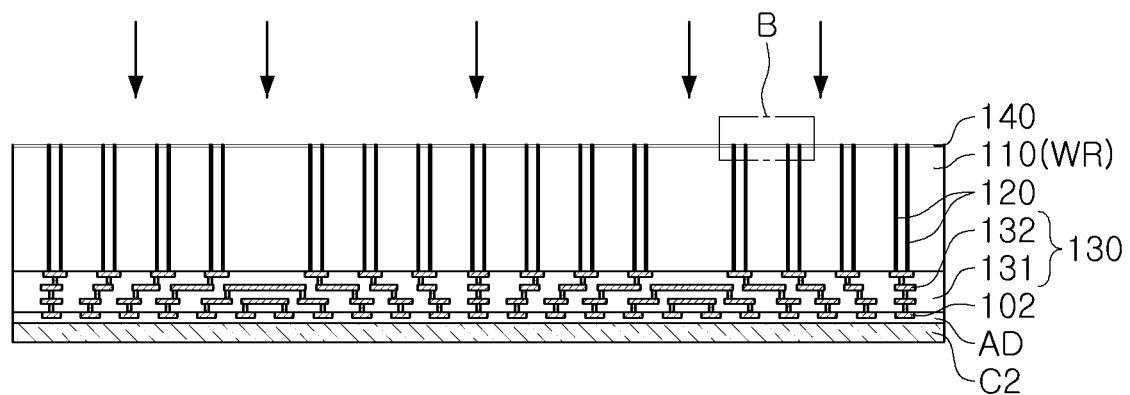
Figures 2, 5C:
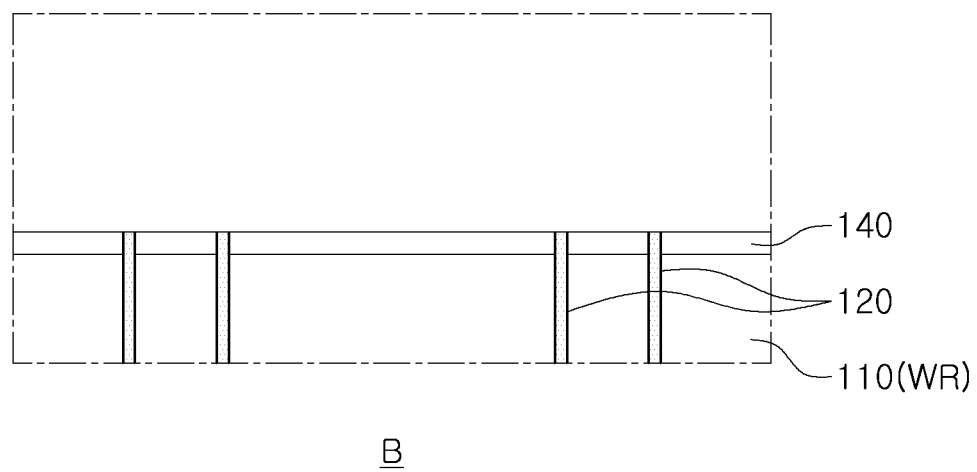

Referring to FIG. 5C-1 and FIG. 5C-2, which is an enlarged view of region B of FIG. 5C-1, a portion of the semiconductor wafer WR may be removed to expose the through via 120 and a first passivation layer 140 may be formed on the first surface S1 of the semiconductor wafer WR. A portion of the semiconductor wafer WR may be removed using a chemical mechanical polishing (CMP) process, an etch-back process, or a combination thereof. A portion of the semiconductor wafer WR may be removed so that the through via 120 protrudes further than the first surface S1. A side surface of the through via 120 that protrudes may be surrounded by the first passivation layer 140.

Figures 1, 5D:
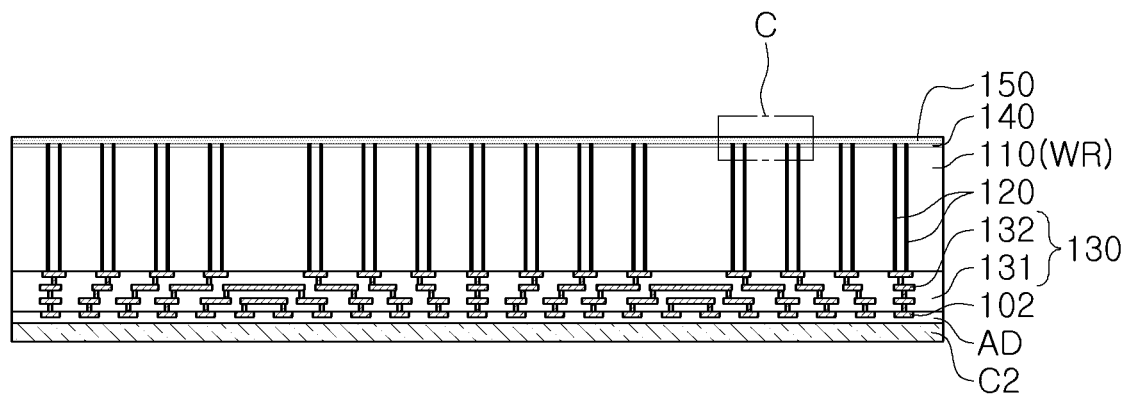
Figures 2, 5D:
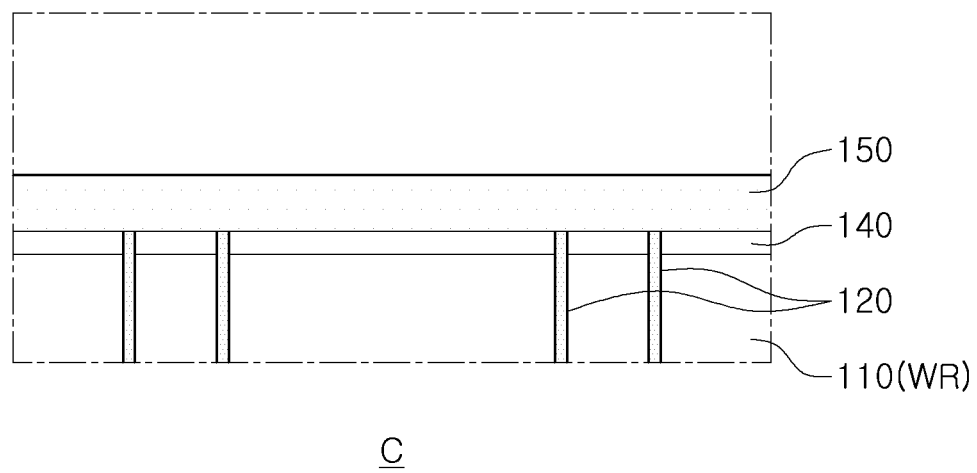

Referring to FIG. 5D-1 and FIG. 5D-2, which is an enlarged view of region C of FIG. 5D-1, a second passivation layer 150 may be formed on the first passivation layer 140 disposed on the first surface S1 of the semiconductor wafer WR. The second passivation layer 150 may be made of an insulating polymer. The second passivation layer 150 may be formed by, for example, a spin coating process or a spray process.

Figures 1, 5E:
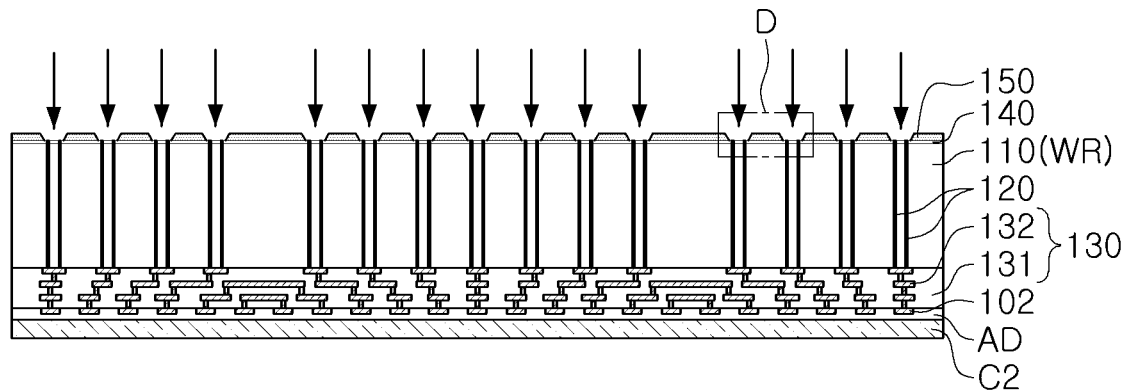
Figures 2, 5E:
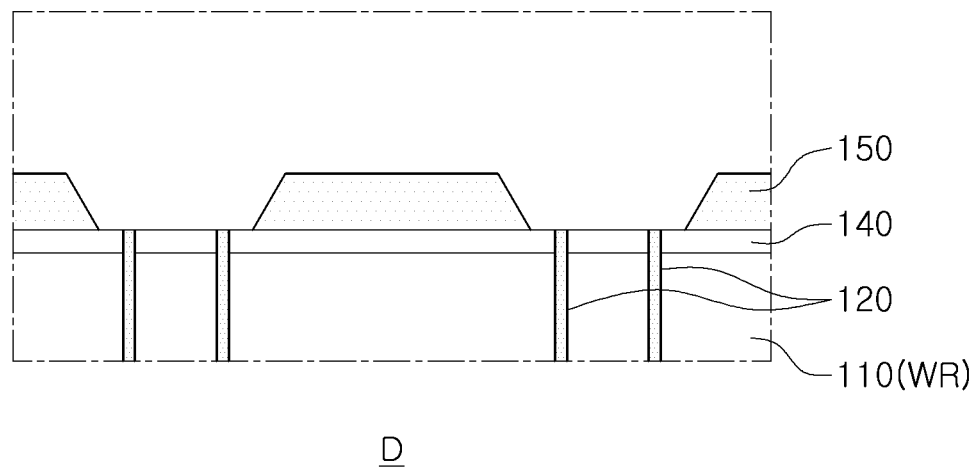

Referring to FIG. 5E-1 and FIG. 5E-2, which is an enlarged view of region D of FIG. 5E-1, a portion of the second passivation layer 150 may be removed by a photo etching process, or the like to expose a portion of the first passivation layer 140 and the surface of the through via 120. A portion of the second passivation layer 150 may be removed such that an opening OP having inclined side surfaces SA may be formed. The opening OP may have a shape whose width or diameter decreases closer to the first passivation layer 140.

Figures 1, 5F:
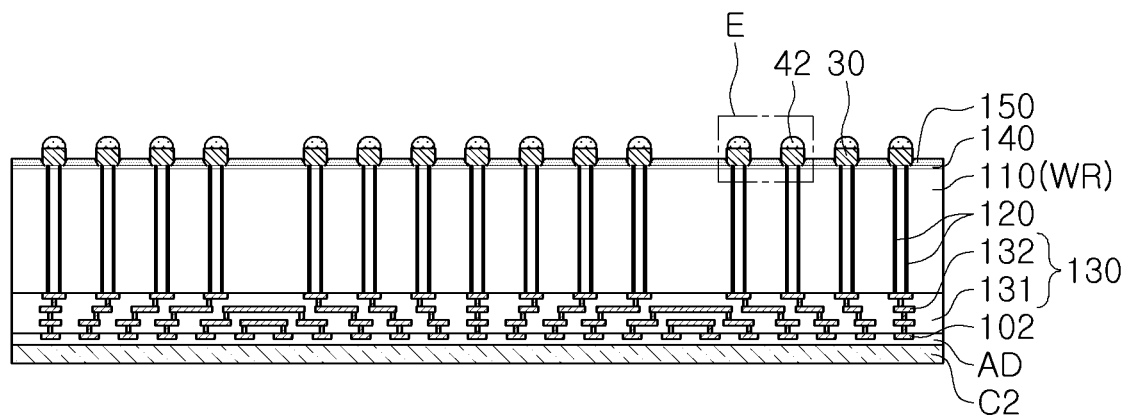
Figures 2, 5F:
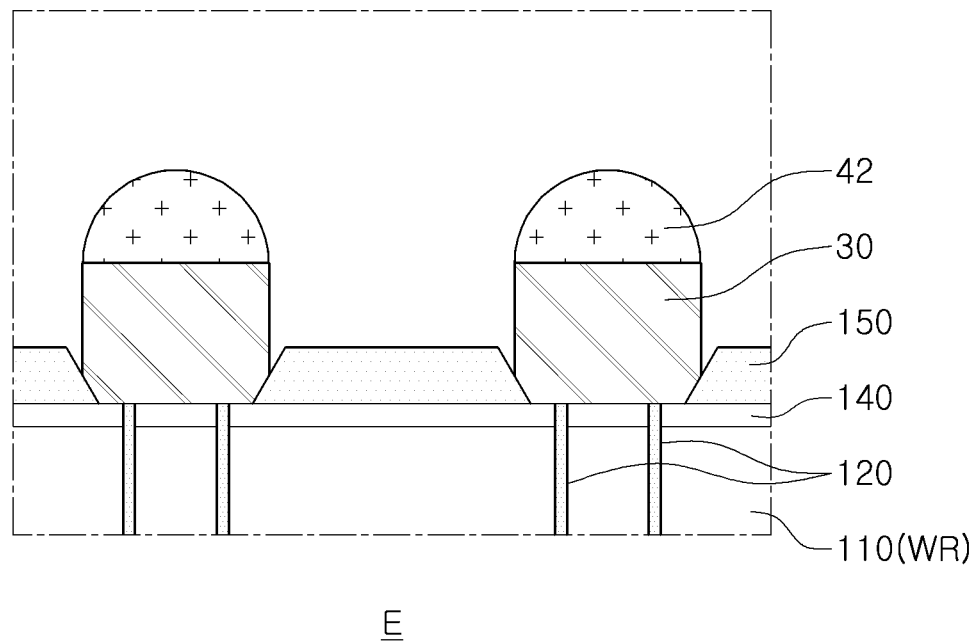

Referring to FIG. 5F-1 and FIG. 5F-2, which is an enlarged view of region E of FIG. 5F-1, one of the conductive pillars 30 and a second conductive bump 42 may be formed on the opening OP of the second passivation layer 150. The conductive pillars 30 may be formed using a photolithography process and a plating process. Side surfaces of the conductive pillars 30 may overlap the inclined side surfaces SA of the second passivation layer 150 in a vertical direction (Z direction). The second conductive bump 42 may be formed on one of the conductive pillars 30. Accordingly, an interposer substrate 100 may be formed.

Next, referring to FIG. 1, the interposer substrate 100 may be attached on the base substrate 10, and the semiconductor chips 60 may be mounted on the interposer substrate 100 such that the semiconductor package 1000A may be manufactured.

Figure 6:
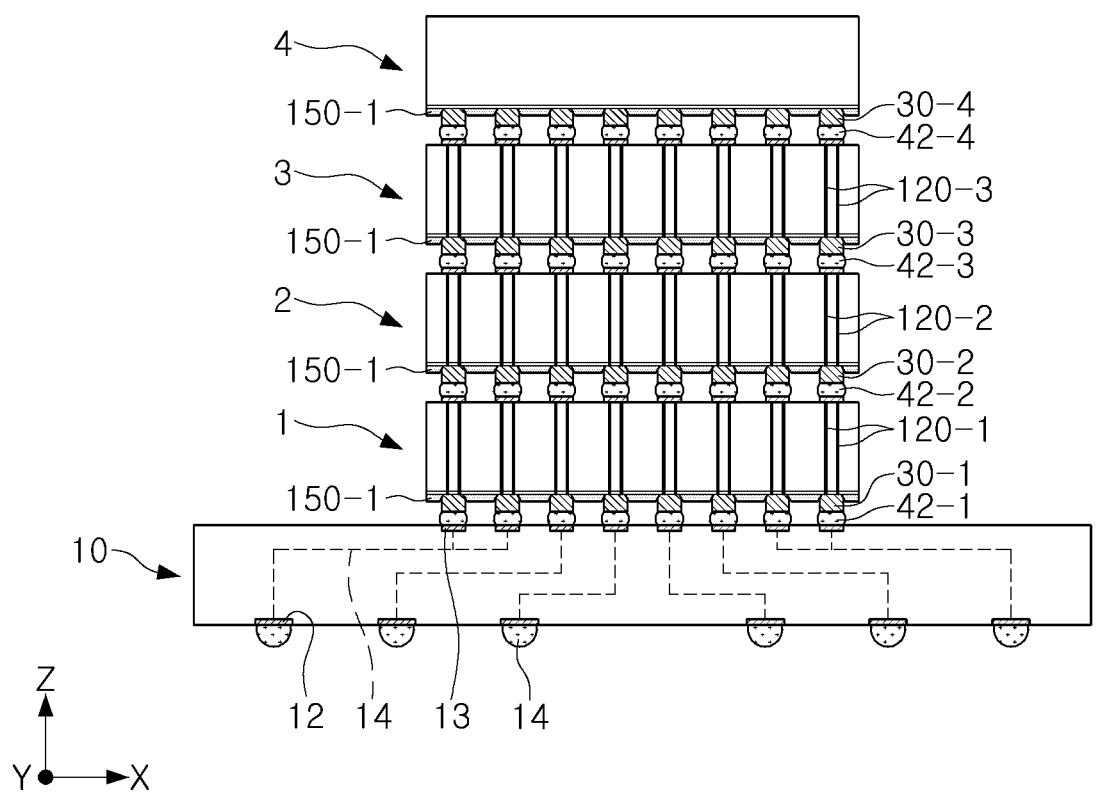
FIG. 6 is a cross-sectional view illustrating a semiconductor package according to example embodiments.

FIG. 6 is a cross-sectional view illustrating a semiconductor package according to example embodiments.

Referring to FIG. 6, a semiconductor package 2000 may include a plurality of semiconductor chips 1, 2, 3, and 4 stacked on the base substrate 10 in a vertical direction (Z direction). The plurality of semiconductor chips 1, 2, 3, and 4 may include a high bandwidth memory (HBM). Each of the plurality of semiconductor chips 1, 2, 3 and 4 may be electrically connected to each other through vias 120-1, 120-2 and 120-3. The through vias 120-1, 120-2 and 120-3 may be electrically connected to conductive pillars 30-1, 30-2, 30-3, and 30-4 and conductive bumps 42-1, 42-2, 42-3, and 42-4 disposed in the opening of the passivation layers 150-1, 150-2, 150-3, and 150-4 disposed on the lower surface of each of the semiconductor chips 1, 2, 3, and 4. With respect to the second passivation layer 150, the same or similar contents described with reference to FIGS. 1 and 2A may be applied.

Figure 7:
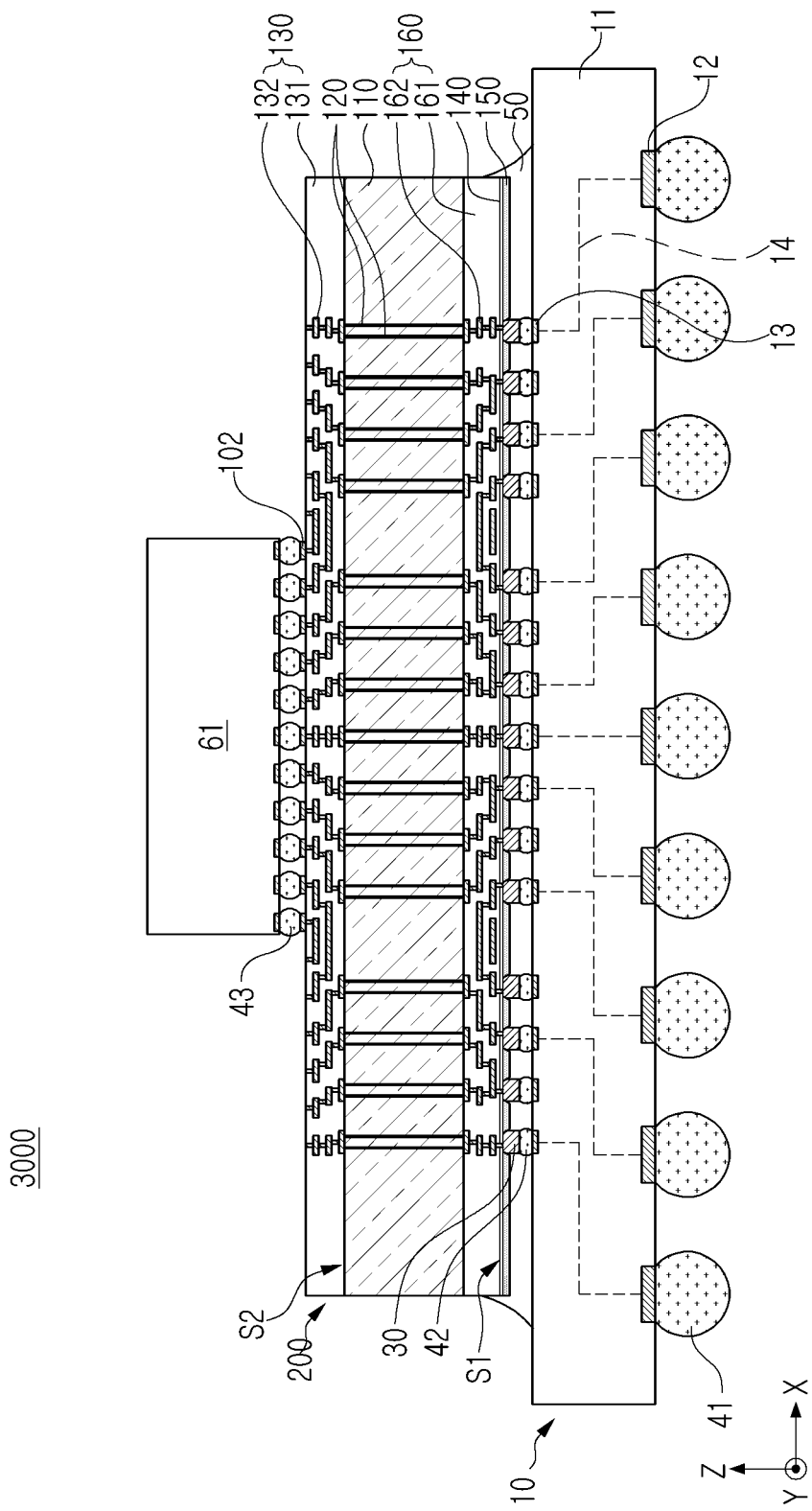
FIG. 7 is a cross-sectional view illustrating a semiconductor package according to example embodiments.

FIG. 7 is a cross-sectional view illustrating a semiconductor package according to example embodiments.

Referring to FIG. 7, a semiconductor package 3000 may include a wiring region 130 (a first wiring region) disposed on a front surface of the semiconductor substrate 110 and a second wiring region 160 disposed on a bottom (or a back surface). The second wiring region 160 may include a second interlayer insulating layer 161 and a third wiring structure 162. The second interlayer insulating layer 161 may be disposed on the first surface S1 of the semiconductor substrate 110, and may include silicon oxide or silicon nitride. The third wiring structure 162 may include a single layer or multiple layers of metal wiring, and may be connected to each other through contact vias.

A first passivation layer 140 and a second passivation layer 150 may be disposed on the bottom surface of the first semiconductor chip 200, and the conductive pillars 30 and the second conductive bump 42 described above may be disposed in the opening OP to control warpage of the semiconductor package. The first semiconductor chip 61 may be stacked on the first semiconductor chip 200, and may include, for example, a volatile memory device such as dynamic RAM (DRAM), static RAM (SRAM), a non-volatile memory device such as phase change RAM (PRAM), magnetic RAM (MRAM), resistive RAM (RRAM), a flash memory device, or the like, a high-performance memory device such as a high-performance memory device such as a high bandwidth memory (HBM), a hybrid memory cubic (HMC), or the like. The conductive pillars 30 may be directly connected to a contact via of the third wiring structure 162 without a connection pad.

As set forth above, by disposing a passivation layer including an opening having an inclined side surface to cover a backside of an interposer substrate, and disposing a conductive pillar to be in partial contact with or overlap the inclined side surface, warpage may be controlled without a connection pad, such that a semiconductor package having improved reliability may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present disclosure.

What is claimed is:

1. A semiconductor package, comprising:
a base substrate comprising a first wiring structure;
an interposer substrate comprising:
　a semiconductor substrate having a first surface facing the base substrate, and a second surface opposite of the first surface,
　a first passivation layer covering at least a portion of the first surface,
　a wiring region disposed on the second surface and comprising a second wiring structure,
　a through via penetrating through the semiconductor substrate and the first passivation layer to electrically connect the second wiring structure and the first wiring structure, and
　a second passivation layer covering at least a portion of the first passivation layer and having an opening exposing a lower surface of the through via;
a conductive pillar disposed between the base substrate and the interposer substrate, extending from the opening of the second passivation layer, and connected to the through via;
a conductive bump disposed between the conductive pillar and the base substrate, and electrically connecting the through via and the first wiring structure;
an underfill resin that fills space between the base substrate and the interposer substrate; and
a first semiconductor chip and a second semiconductor chip disposed on the wiring region of the interposer substrate, and electrically connected to each other through the second wiring structure,
wherein the opening of the second passivation layer has inclined side surfaces such that a width of the opening decreases towards the first passivation layer, and
wherein side surfaces of the conductive pillar are positioned to overlap the inclined side surfaces of the second passivation layer in a vertical direction.

2. The semiconductor package of claim 1, wherein the conductive pillar is in contact with the lower surface of the through via.

3. The semiconductor package of claim 1, wherein the conductive pillar is in contact with a portion of a lower surface of the first passivation layer and a portion of the inclined side surfaces of the second passivation layer.

4. The semiconductor package of claim 1, wherein the underfill resin is in contact with a portion of the inclined side surfaces of the second passivation layer.

5. The semiconductor package of claim 1, wherein an upper region of the side surfaces of the conductive pillar is inclined to correspond to the inclined side surfaces of the second passivation layer.

6. The semiconductor package of claim 1, wherein no connection pad is disposed between the conductive pillar and the through via.

7. The semiconductor package of claim 1, wherein the second passivation layer does not include a step other than one or more of the opening.

8. The semiconductor package of claim 1, wherein the conductive pillar comprises an under bump metal layer and a pillar layer covering a lower surface of the under bump metal layer, and
wherein the under bump metal layer is in contact with a portion of the inclined side surfaces of the second passivation layer.

9. The semiconductor package of claim 1, wherein the conductive pillar comprises a plurality of stacked conductive layers.

10. The semiconductor package of claim 1, further comprising,
a molding member sealing at least a portion of the first semiconductor chip and the second semiconductor chip on the interposer substrate;
a stiffener disposed on the base substrate, outside of the interposer substrate; and
a heat sink disposed on the first semiconductor chip and the second semiconductor chip.

11. A semiconductor package, comprising:
an interposer substrate comprising:

a semiconductor substrate,
a first passivation layer on a first surface of the semiconductor substrate,
a wiring region on a second surface of the semiconductor substrate,
a through via penetrating through the semiconductor substrate and the first passivation layer and electrically connected to the wiring region, and
a second passivation layer having an opening exposing a lower surface of the through via;
a plurality of semiconductor chips disposed on the wiring region of the interposer substrate;
a conductive pillar connected to the through via through the opening of the second passivation layer; and
a conductive bump disposed below the conductive pillar,
wherein the opening of the second passivation layer has inclined side surfaces such that a width of the opening decreases towards the first passivation layer, and
wherein the conductive pillar is in contact with a portion of a lower surface of the first passivation layer and a portion of the inclined side surfaces of the second passivation layer.

12. The semiconductor package of claim 11, further comprising an underfill resin surrounding side surfaces of the conductive pillar and side surfaces of the conductive bump, and in contact with other portions of the inclined side surfaces that are not in contact with the conductive pillar.

13. The semiconductor package of claim 11, wherein a top end of the opening of the second passivation layer has a first width that is a minimum width of the opening and a bottom end of the opening has a second width that is a maximum width of the opening, and
a third width of the conductive pillar in the opening is greater than or equal to the first width or less than or equal to the second width.

14. The semiconductor package of claim 11, wherein the conductive pillar and the through via are directly connected without a connection pad therebetween.

15. The semiconductor package of claim 11, wherein a portion of the conductive pillar has a width that continuously decreases towards the first passivation layer.

16. The semiconductor package of claim 11, wherein side surfaces of the conductive pillar overlap the inclined side surfaces of the second passivation layer in a vertical direction.

17. The semiconductor package of claim 11, wherein the second passivation layer has a thickness greater than a thickness of the first passivation layer.

18. A semiconductor package, comprising:
an interposer substrate comprising:
a semiconductor substrate having a first surface and a second surface that is opposite to the first surface,
a first passivation layer covering at least a portion of the first surface,
wiring layers disposed on the second surface,
through vias penetrating through the semiconductor substrate and the first passivation layer, and electrically connected to the wiring layers, and
a second passivation layer covering at least a portion of the first passivation layer and having openings exposing a lower surface of each of the through vias;
a plurality of semiconductor chips disposed on the interposer substrate, and electrically connected to each other through the wiring layers;
conductive pillars respectively connected to the through vias through each of the openings;
conductive bumps disposed below each of the conductive pillars; and
a base substrate comprising pads respectively connected to the conductive bumps, and further comprising a wiring structure electrically connected to the pads,
wherein one or more of the openings of the second passivation layer have inclined side surfaces such that widths of the one or more openings decrease towards the first passivation layer,
wherein side surfaces of one or more of the conductive pillars are positioned to overlap the inclined side surfaces of the second passivation layer in a vertical direction, and
wherein the conductive pillars and the through vias are directly connected without a connection pad therebetween, respectively.

19. The semiconductor package of claim 18, wherein a portion of one or more of the conductive pillars has a width that continuously decreases towards the first passivation layer.

20. The semiconductor package of claim 18, wherein one or more of the conductive pillars are in contact with a portion of a lower surface of the first passivation layer and a portion of the inclined side surfaces of the second passivation layer.

* * * * *